(12) United States Patent
Kageshima et al.

(10) Patent No.: US 9,607,832 B2
(45) Date of Patent: *Mar. 28, 2017

(54) EPITAXIAL WAFER MANUFACTURING DEVICE AND MANUFACTURING METHOD

(75) Inventors: Yoshiaki Kageshima, Chichibu (JP); Tomoyuki Noguchi, Kawasaki (JP); Daisuke Muto, Chichibu (JP); Kenji Momose, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 335 days.

This patent is subject to a terminal disclaimer.

(21) Appl. No.: 14/236,951

(22) PCT Filed: Aug. 2, 2012

(86) PCT No.: PCT/JP2012/069695
§ 371 (c)(1),
(2), (4) Date: Feb. 4, 2014

(87) PCT Pub. No.: WO2013/021909
PCT Pub. Date: Feb. 14, 2013

(65) Prior Publication Data
US 2014/0190400 A1 Jul. 10, 2014

(30) Foreign Application Priority Data
Aug. 5, 2011 (JP) .................................. 2011-171635

(51) Int. Cl.
*C30B 25/02* (2006.01)
*H01L 21/02* (2006.01)
(Continued)

(52) U.S. Cl.
CPC .... *H01L 21/02634* (2013.01); *C23C 16/4401* (2013.01); *C30B 25/08* (2013.01);
(Continued)

(58) Field of Classification Search
CPC ........ C30B 35/005; C30B 25/02; C30B 25/04
See application file for complete search history.

(56) References Cited

U.S. PATENT DOCUMENTS

2003/0185965 A1 10/2003 Lin et al.
2004/0003779 A1 1/2004 Jurgensen et al.
(Continued)

FOREIGN PATENT DOCUMENTS

EP 1 060 301 A0 12/2000
EP 2 735 630 A1 5/2014
(Continued)

OTHER PUBLICATIONS

Communication dated Sep. 15, 2015 from the Japanese Patent Office in counterpart application No. 2011-171635.
(Continued)

*Primary Examiner* — Robert M Kunemund
(74) *Attorney, Agent, or Firm* — Sughrue Mion, PLLC

(57) ABSTRACT

Provided is an epitaxial wafer manufacturing device (1) that deposits and grows epitaxial layers on the surfaces of wafers W while supplying a raw material gas to a chamber, wherein a shield (12), arranged in close proximity to the lower surface of a top plate (3) so as to prevent deposits from being deposited on the lower surface of the top plate (3), is removably attached inside the chamber, has an opening (13) in the central portion thereof that forces a gas inlet (9) to face the inside of a reaction space K, and has a structure in which it is concentrically divided into a plurality of ring plates (16), (17) and (18) around the opening (13).

11 Claims, 7 Drawing Sheets

(51) Int. Cl.
*C30B 29/36* (2006.01)
*C30B 25/08* (2006.01)
*C23C 16/44* (2006.01)

(52) U.S. Cl.
CPC ........ *C30B 29/36* (2013.01); *H01L 21/02378* (2013.01); *H01L 21/02529* (2013.01)

(56) References Cited

U.S. PATENT DOCUMENTS

| | | |
|---|---|---|
| 2004/0086689 A1 | 5/2004 | Takahashi et al. |
| 2011/0207299 A1 | 8/2011 | Sakurai |
| 2014/0230722 A1 | 8/2014 | Kageshima et al. |

FOREIGN PATENT DOCUMENTS

| | | |
|---|---|---|
| JP | 2000-068208 A | 3/2000 |
| JP | 2001-192818 A | 7/2001 |
| JP | 2004-507897 A | 3/2004 |
| JP | 2005-93477 A | 4/2005 |
| JP | 2005-235845 A | 9/2005 |
| JP | 2006-028625 A | 2/2006 |
| JP | 2006-339673 A | 12/2006 |
| JP | 2008-177187 A | 7/2008 |
| JP | 2009-164162 A | 7/2009 |
| JP | 2010-255083 A | 11/2010 |
| WO | 2010/053094 A1 | 5/2010 |

OTHER PUBLICATIONS

Extended European Search Report dated Feb. 5, 2015, issued by the European Patent Office in counterpart European application No. 12821468.1.
Bernd Thomas, et al., "Epitaxial Growth of n-Type 4H-SiC on 3" Wafers for Power Devices", Materials Science Forum, 2005, pp. 141-146, vol. 483-485.
James D. Oliver, et al., "A Designed Experiment Approach to Improvement and Understanding of the SiC Epitaxial Growth Process", Materials Science Forum, 2007, pp. 57-60, vol. 556-557.
International Search Report for PCT/JP2012/069695 dated Nov. 6, 2012.
Communication dated Sep. 15, 2015 from the Japanese Patent Office in application No. 2011-171636.
Communication dated Feb. 13, 2015, issued by the European Patent Office in Application No. 12822286.6.
International Search Report for PCT/JP2012/069858, dated Nov. 6, 2012.
Office Action from USPTO dated Feb. 12, 2016, issued in U.S. Appl. No. 14/236,272, 16 pages.
Final Office Action from the USPTO dated Jul. 20, 2016, in U.S. Appl. No. 14/236,272, 5 pages.

CROSS-SECTION TAKEN ALONG X-X'

CROSS-SECTION TAKEN ALONG X-X'

CROSS-SECTION TAKEN ALONG X-X'

EPITAXIAL WAFER MANUFACTURING DEVICE AND MANUFACTURING METHOD

CROSS REFERENCE TO RELATED APPLICATIONS

This application is a National Stage of International Application No. PCT/JP2012/069695 filed Aug. 2, 2012, claiming priority based on Japanese Patent Application No. 2011-171635 filed Aug. 5, 2011, the contents of all of which are incorporated herein by reference in their entirety.

TECHNICAL FIELD

The present invention relates to an epitaxial wafer manufacturing device that deposits and grows an epitaxial layer on the surface of a heated wafer while supplying a raw material gas inside a chamber, and an epitaxial wafer manufacturing method that uses this manufacturing device.

BACKGROUND ART

Silicon carbide (SiC), for example, has the outstanding properties of having a band gap roughly three times wider, dielectric breakdown electric field strength roughly ten times stronger, and thermal conductivity roughly three times greater than silicon (Si), and is expected to be used in applications such as power devices, high-frequency devices or high-temperature operation devices.

SiC epitaxial wafers are normally used to manufacture such SiC semiconductor devices. SiC epitaxial wafers are fabricated by epitaxially growing an SiC single crystal thin layer (epitaxial layer) to serve as the active region of the SiC semiconductor device on the surface of an SiC single crystal substrate (wafer) fabricated using a method such as sublimation recrystallization.

In addition, a chemical vapor deposition (CVD) device, which deposits and grows an SiC epitaxial layer on the surface of a heated SiC wafer while supplying a raw material gas to a chamber, is used for the epitaxial wafer manufacturing device.

In this CVD device, the SiC wafer is required to be heated to a high temperature in order to induce epitaxial growth of the SiC epitaxial layer. Consequently, a method is used in which the susceptor on which the wafer is mounted and the ceiling (top plate) arranged opposing the upper surface of this susceptor are heated by high-frequency induction heating, and the wafer is heated by radiant heat from the susceptor and ceiling (see Patent Documents 1 and 2). Thus, susceptors and ceilings made of graphite (carbon) are used since they are suitable for high-frequency induction heating.

However, in a CVD device, deposits of the SiC epitaxial layer are also deposited not only on the surface of the SiC wafer, but also on the surface of the ceiling during film formation. As a result of repeating film formation, there were cases in which deposits deposited on the surface of the ceiling separated from the ceiling and fell onto the surface of the SiC wafer.

In this case, the film quality of the SiC epitaxial layer was significantly impaired due to the deposits (particles) adhered to the surface of the SiC epitaxial layer and the deposits (downfall) embedded in the SiC epitaxial layer.

This type of problem is particularly prominent in volume production-type CVD devices that repeatedly carry out film formation. Consequently, CVD devices require that cleaning work be periodically performed to remove deposits deposited on the ceiling and other locations inside the chamber.

However, since the size of the chamber is quite large in the case of volume production-type CVD devices, not only does the aforementioned cleaning work require considerable time, but unless this cleaning work is performed properly, the problem of conversely increasing the amounts of particles and downfall ends up occurring. Thus, it is essential to reduce the levels of the aforementioned particles and downfall in order to improve the product yield of SiC epitaxial wafers.

Therefore, in the invention described in Patent Document 2 indicated below, adhesion of deposits (particles) deposited on the ceiling to a wafer as a result of falling onto the wafer is proposed to be prevented by a cover plate by arranging a cover plate for covering the wafer between the wafer mounted on the susceptor and the ceiling (top plate) opposing the susceptor.

However, in this case, although deposits deposited on the ceiling can be prevented from falling onto the wafer, since the deposition of deposits on the ceiling cannot be prevented, bothersome cleaning work is required for removing the aforementioned deposits deposited on the ceiling.

On the other hand, a CVD device has also been proposed that inhibits particle generation by composing the ceiling with a large-sized SiC single crystal material and improving the adhesion of deposits to the surface of this ceiling (see Patent Document 3).

However, since a ceiling composed of a large-sized SiC single crystal material is susceptible to warping and cracking by high-temperature heating during film formation, it is difficult to stably use such a ceiling composed of a large-sized SiC single crystal material for a long period of time. In addition, large-sized SiC single crystal materials are also extremely expensive and SiC single crystal substrates in excess of 4 inches are difficult to acquire, thereby resulting in problems in terms of fabricating the CVD device as well.

DOCUMENT OF RELATED ART

Patent Documents

Patent Document 1: Japanese Translation of PCT International Application Publication No. 2004-507897
Patent Document 2: Japanese Unexamined Patent Application, First Publication No. 2009-164162
Patent Document 3: Japanese Unexamined Patent Application, First Publication No. 2005-235845

Non-Patent Documents

Non-Patent Document 1: Materials Science Forum, Vols. 483-485 (2005), pp. 141-146
Non-Patent Document 2: Materials Science Forum, Vols. 556-557 (2007), pp. 57-60

SUMMARY OF INVENTION

Technical Problem

The present invention was proposed with the foregoing in view, and an object thereof is to provide an epitaxial wafer manufacturing device that enables a high-quality epitaxial layer to be stably deposited and grown on the surface of a wafer by reducing the levels of the aforementioned particles and downfall, and an epitaxial wafer manufacturing method capable of further improving product yield by using this manufacturing device.

Means for Solving the Problems

The present invention provides the means indicated below.

(1) An epitaxial wafer manufacturing device that deposits and grows epitaxial layers on the surfaces of heated wafers while supplying a raw material gas to a chamber, provided with:

a susceptor having a plurality of mounting portions on which the wafers are mounted, wherein the plurality of mounting portions are arranged in a row in the circumferential direction;

a top plate arranged in opposition to the upper surface of the susceptor so as to form a reaction space between the top plate and the susceptor;

a heating means arranged on the lower surface side of the susceptor and/or upper surface side of the top plate for heating the wafers mounted on the mounting portions;

a gas supply means having a gas inlet for introducing the raw material gas from a central portion of the upper surface of the top plate to the reaction space, that supplies raw material gas released from the gas inlet from the inside to the outside of the reaction space; and, a shield arranged in close proximity to the lower surface of the top plate so as to prevent deposits from being deposited on the lower surface of the top plate; wherein, in addition to being removably attached inside the chamber, the shield has an opening in the central portion thereof that forces the gas inlet to face the inside of the reaction space, and has a structure in it is divided into a plurality of ring plates that are concentric around the opening.

(2) The epitaxial wafer manufacturing device described in (1) above, provided with a sidewall located outside the susceptor and the top plate and arranged so as to surround the periphery of the reaction space, wherein a support portion for supporting the shield is provided on the inner peripheral surface of the sidewall.

(3) The epitaxial wafer manufacturing device described in (2) above, wherein the support portion is a step portion provided over the entire circumference on the inner peripheral surface of the sidewall, and supports the shield in a state in which the outer peripheral portion of the shield is mounted on this step portion.

(4) The epitaxial wafer manufacturing device described in any of (1) to (3) above, wherein, among adjacent ring plates on both sides of each dividing line of the plurality of concentrically divided ring plates, an inner step portion provided on the outer peripheral portion on the lower surface side of the ring plate located to the inside of the dividing line, and an outer step portion provided on the inner peripheral portion on the upper surface side of the ring plate located to the outside of the dividing line, are engaged in a state in which their mutual step surfaces are in contact, and a gap is provided between the lateral surface of the inner step portion and the lateral surface of the outer step portion.

(5) The epitaxial wafer manufacturing device described in any of (1) to (4) above, wherein at least the lower surfaces of the plurality of concentrically divided ring plates are on the same plane.

(6) The epitaxial wafer manufacturing device described in any of (1) to (5) above, wherein the shield has a structure in which it is divided into an inner peripheral ring plate, a central ring plate and an outer peripheral ring plate moving from the inside to the outside, and a dividing line between the inner peripheral ring plate and the central ring plate is located farther to the inside than the region where the plurality of mounting portions are arranged in a row in the circumferential direction, and a dividing line between the central ring plate and the outer peripheral ring plate is located farther to the outside than the region where the plurality of mounting portions are arranged in a row in the circumferential direction.

(7) The epitaxial wafer manufacturing device described in any of (1) to (4) above, wherein the shield has a structure in which it is divided into an inner peripheral ring plate and an outer peripheral ring plate moving from the inside to the outside, and a dividing line between the inner peripheral ring plate and the outer peripheral ring plate is located farther to the inside or outside than the region where the plurality of mounting portions are arranged in a row in the circumferential direction.

(8) The epitaxial wafer manufacturing device described in (6) or (7) above, wherein the wafer is an SiC single crystal substrate and the epitaxial layer is an SiC single crystal thin film, and in an SiC deposit deposited on the lower surface of the shield, has a region where the ratio of Si is greater to the inside of a region where the ratios of Si and C contained in the SiC deposit are equal, and a dividing line between the inner peripheral ring plate and the central or outer peripheral ring plate is located so that the inner peripheral ring plate is arranged in this region where the ratio of Si is greater.

(9) The epitaxial wafer manufacturing device described in any of (1) to (8) above, wherein any of the ring plates among the plurality of concentrically divided ring plates is divided into a plurality of ring pieces along dividing lines extending in the radial direction centering around the opening.

(10) The epitaxial wafer manufacturing device described in any of (1) to (9) above, wherein the wafer is an SiC single crystal substrate and the epitaxial layer is an SiC single crystal thin film, and a graphite substrate coated with an SiC film on the surface thereof or an SiC substrate is at least used for the ring plate arranged at a location opposing the region where the plurality of mounting portions are arranged in a row in the circumferential direction.

(11) The epitaxial wafer manufacturing device described in any of (1) to (10) above, having a structure wherein the susceptor is driven to rotate about the central axis thereof and the plurality of mounting portions are driven to rotate about their respective central axes.

(12) An epitaxial wafer manufacturing method, comprising a step for depositing and growing an epitaxial layer on the surface of a wafer using the epitaxial wafer manufacturing device described in any of (1) to (11) above.

Effects of the Invention

As has been described above, in the epitaxial wafer manufacturing device according to the present invention, since a shield is arranged in close proximity to the lower surface of a top plate so as to prevent deposits from being deposited on the lower surface of the top plate, deposits are allowed to be deposited on the lower surface of this shield.

In this epitaxial wafer manufacturing device, since a shield is removably attached inside a chamber, the previously described particles and downfall can be reduced simply by carrying out simple maintenance work consisting of replacing the shield without having to carry out bothersome cleaning work for removing deposits deposited on the lower surface of the top plate as in the prior art.

Moreover, in this epitaxial wafer manufacturing device, as a result of having an opening in a central portion that forces a gas inlet to face the inside of the reaction space, and using a plate having a structure in which a plurality of ring plates are concentrically divided centering around this opening, thermal stress acting on the shield can be alleviated among these divided ring plates.

As a result, the generation of warping (deformation), cracking and the like in the shield divided into a plurality of ring plates can be prevented. In addition, deposits deposited on the lower surface of the shield can be inhibited from falling off by preventing the generation of warping (deformation) of this shield. Moreover, it is also possible to only replace a portion of the ring plates of the shield divided into a plurality of ring plates.

In addition, in the epitaxial wafer manufacturing device according to the present invention, a configuration may also be employed in which, in addition to providing a sidewall located outside the susceptor and top plate and arranged so as to surround the periphery of a reaction space, the shield is supported by a support portion provided on the inner peripheral surface of this sidewall.

In this case of this configuration, as a result of only supporting the outer peripheral portion of the shield, the shield can be removably attached inside the chamber while avoiding contact between a gas inlet at a low temperature due to the introduction of raw material gas and the inner peripheral portion of the shield (central portion where an opening is formed) at a high temperature as a result of being heated by heating means.

Moreover, in the epitaxial wafer manufacturing device according to the present invention, a configuration may be employed in which a step portion is provided for the aforementioned step portion over the entire circumference on the inner peripheral surface of the sidewall, and supports the shield in a state in which the outer peripheral portion of the shield is mounted on this step portion.

In the case of this configuration, as a result of the outer peripheral portion of the shield being in contact with the step portion over the entire circumference thereof, inflow of gas from the outer peripheral portion of this shield towards the space between the shield and the top plate can be prevented.

In addition, in the epitaxial wafer manufacturing device according to the present invention, a configuration may be employed in which, among adjacent ring plates on both sides of each dividing line of a plurality of concentrically divided ring plates, an inner step portion provided on the outer peripheral portion on the lower surface side of the ring plate located to the inside of a dividing line, and an outer step portion provided on the inner peripheral portion on the upper surface side of the ring plate located to the outside of the dividing line, are engaged in a state in which their mutual step surfaces are in contact, and a gap is provided between the lateral surface of the inner step portion and the lateral surface of the outer step portion.

In the case of this configuration, the outer peripheral portion of the ring plate located to the inside of the dividing line can be supported by the inner peripheral portion of the ring plate located to the outside of the dividing line as a result of the inner step portion and outer step portion engaging.

In addition, by providing a gap between the lateral surface of the inner step portion and the lateral surface of the outer step portion, contact between lateral surfaces of adjacent ring plates on both sides of a dividing line can be prevented when the shield has undergone thermal expansion as a result of being heated by a heating means.

In addition, in the epitaxial wafer manufacturing device according to the present invention, a configuration may be employed in which at least the lower surfaces of the plurality of concentrically divided ring plates are on the same plane.

In the case of this configuration, since at least the lower surfaces of the plurality of concentrically divided ring plates are on the same plane, a high-quality epitaxial layer can be stably deposited and grown on the surface of a wafer while smoothly supplying a raw material gas released from a gas inlet from the inside to the outside of a reaction space.

In addition, in the epitaxial wafer manufacturing device according to the present invention, in a configuration having a structure in which the aforementioned shield is divided into an inner peripheral ring plate, a central ring plate and an outer peripheral ring plate moving from the inside to the outside, a dividing line between the inner peripheral ring plate and the central ring plate is located farther to the inside than a region where the plurality of mounting portions are arranged in a row in the circumferential direction, and a dividing line between the central ring plate and the outer peripheral ring plate is located farther to the outside than the region where the plurality of mounting portions are arranged in a row in the circumferential direction.

In this case of this configuration, as a result of dividing the shield into three sections consisting of an inner peripheral ring plate, a central ring plate and an outer peripheral ring plate, thermal stress acting on the shield can be alleviated among these three divided ring plates. In particular, as a result of positioning the dividing line between the inner peripheral ring plate and the central ring plate farther to the inside than the region where the plurality of mounting portions are arranged in a row in the circumferential direction, while positioning the dividing line between the central ring plate and the outer peripheral ring plate farther to the outside than the region where the plurality of mounting portions are arranged in a row in the circumferential direction, thermal stress acting on the inner peripheral side and outer peripheral side of the shield, where there are particularly large changes in heat, can be efficiently alleviated.

In addition, in the epitaxial wafer manufacturing device according to the present invention, in a configuration in which the aforementioned shield has a structure in which it is divided into an inner peripheral ring plate and an outer peripheral ring plate moving from the inside to the outside, a dividing line between the inner peripheral ring plate and the outer peripheral ring plate is located farther to the inside or outside than the region where the plurality of mounting portions are arranged in a row in the circumferential direction.

In the case of this configuration, as a result of dividing the shield into two sections consisting of an inner peripheral ring plate and outer peripheral ring plate, thermal stress acting on the shield can be alleviated between these two divided ring plates. In particular, as a result of positioning the dividing line between the inner peripheral ring plate and the outer peripheral ring plate farther to the inside than the region where the plurality of mounting portions are arranged in a row in the circumferential direction, thermal stress acting on the inner peripheral side of the shield, where there are particularly large changes in heat, can be efficiently alleviated. On the other hand, as a result of positioning the dividing line between the inner peripheral ring plate and the outer peripheral ring plate farther to the outside than the region where the plurality of mounting portions are arranged in a row in the circumferential direction, thermal stress acting on the outer peripheral side of the shield, where there are particularly large changes in heat, can be efficiently alleviated.

In addition, in the epitaxial wafer manufacturing device according to the present invention, a configuration may be employed in which, in the case the wafer is an SiC single crystal substrate and the epitaxial layer is an SiC single crystal thin film, in an SiC deposit deposited on the lower surface of the shield, there is a region where the ratio of Si is greater to the inside of a region where the ratios of Si and C contained in the SiC deposit are equal, and a dividing line between the inner peripheral ring plate and the central or outer peripheral ring plate is located so that the inner peripheral ring plate is arranged in this region where the ratio of Si is greater.

In the case of this configuration, the growth of SiC deposits is faster in the region where the ratio of Si is greater than the region where the ratios of Si and C are equal. Thus, the times at which other ring plates are replaced can be extended by replacing only the inner peripheral ring plate of the shield divided into a plurality of ring plates that are arranged in this region where the ratio of Si is greater.

In addition, in the epitaxial wafer manufacturing device according to the present invention, a configuration may be employed in which any of the ring plates among the plurality of concentrically divided ring plates is divided into a plurality of ring pieces along dividing lines extending in the radial direction centering around an opening.

In the case of this configuration, as a result of dividing a ring plate that composes the shield into a plurality of ring pieces, thermal stress acting on the shield can be alleviated among these divided ring pieces.

In addition, in the epitaxial wafer manufacturing device according to the present invention, in the case the wafer is an SiC single crystal substrate and the epitaxial layer is an SiC single crystal thin film, a graphite substrate coated with an SiC film on the surface thereof or an SiC substrate is at least used for the ring plate arranged at a location opposing the region where the plurality of mounting portions are arranged in a row in the circumferential direction.

In the case of this configuration, as a result of the same SiC as the epitaxial layer being used for the surface of the aforementioned ring plate, depositability of deposits can be enhanced and deposits deposited on the lower surface of this ring plate can be inhibited from falling off. In addition, the time at which the aforementioned ring plate is replaced can be extended.

In addition, in the epitaxial wafer manufacturing device according to the present invention, a configuration may be employed having a structure in which, in addition to a susceptor being driven to rotate about the central axis thereof, a plurality of mounting portions are driven to rotate about their respective central axes.

In the case of this configuration, a step for depositing and growing an epitaxial layer on the surface of a wafer can be carried out uniformly for each wafer mounted on a plurality of mounting portions.

In addition, in the epitaxial wafer manufacturing method according to the present invention, a high-quality epitaxial layer can be stably deposited and grown on the surface of a wafer by using any of the epitaxial wafer manufacturing devices described above. Since the amount of time spent on maintenance can be shortened, the product yield of epitaxial wafers can be further improved.

DESCRIPTION OF EMBODIMENTS

The following provides a detailed explanation of the epitaxial wafer manufacturing device and method to which the present invention is applied with reference to the drawings.

The drawings used in the following explanation may be shown with those characteristic portions suitably enlarged in order to facilitate the understanding of those characteristics, and therefore the dimensional ratios of each constituent feature are not necessarily the same as actual ratios. In addition, the materials, dimensions and the like exemplified in the following explanation are merely examples, and the present invention is not necessarily limited thereto and can be carried out by suitably modifying within a range that does not deviate from the gist thereof.

(Epitaxial Wafer Manufacturing Device)

Figure 1:
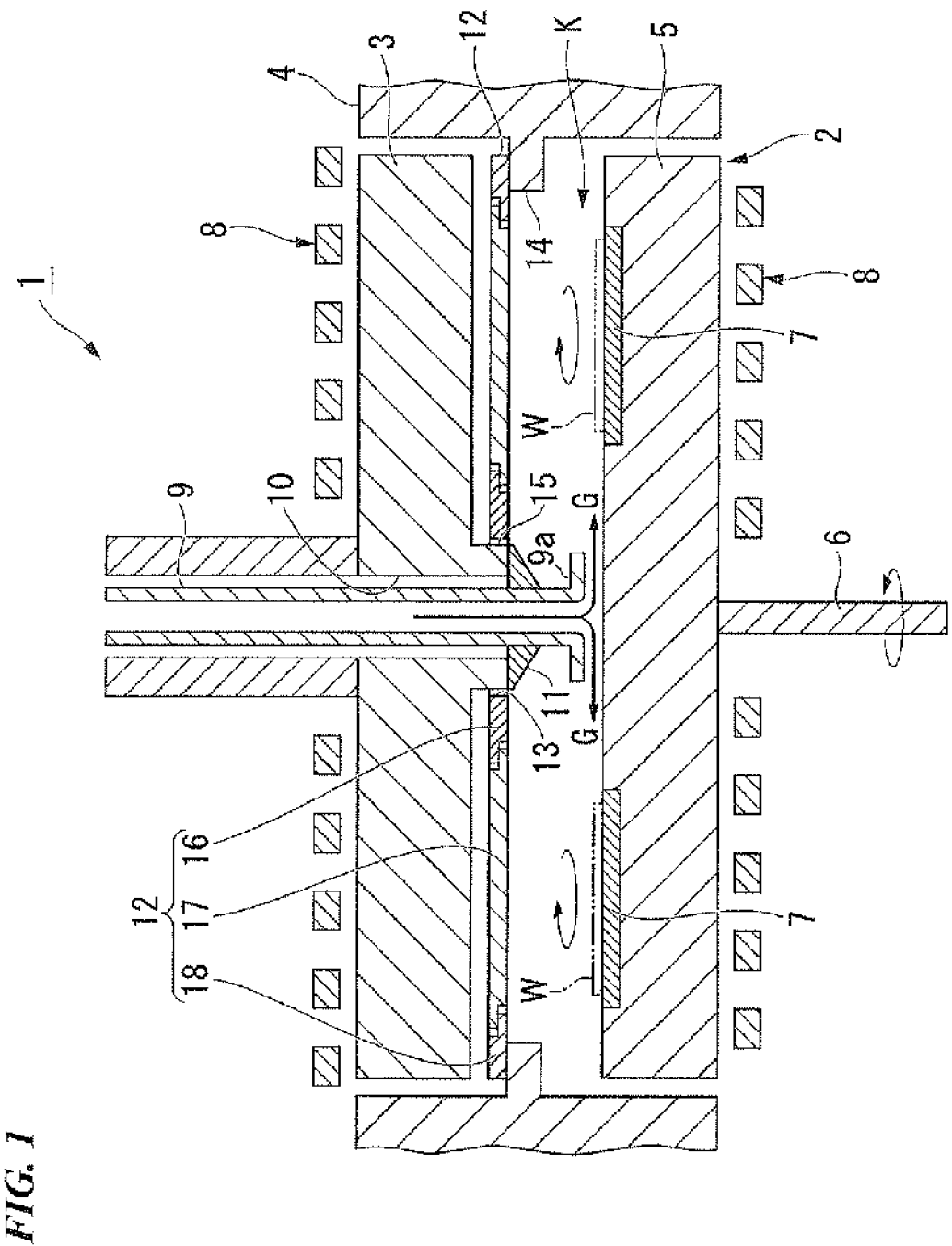
FIG. 1 is a cross-sectional schematic diagram showing an example of an epitaxial wafer manufacturing device to which the present invention is applied.

The epitaxial wafer manufacturing device to which the present invention is applied is a CVD device 1 as shown in FIG. 1, for example. In this device, SiC epitaxial layers (not shown) are deposited and grown on the surfaces of heated SiC wafers while supplying an SiC raw material gas G to a chamber (film formation chamber) capable of depressurization and evacuation not shown in the drawings. The raw material gas G can be suitably selected, and for example, that containing silane ($SiH_4$) for the Si source and propane ($C_3H_8$) for the C source can be used, while that containing hydrogen ($H_2$) can be used as a carrier gas.

More specifically, this CVD device 1 is provided with a susceptor 2 on which is mounted a plurality of SiC wafers W, a ceiling (top plate) 3 arranged in opposition to the upper surface of the susceptor 2 so as to form a reaction space K between the ceiling 3 and the susceptor 2, and a sidewall 4 located outside the susceptor 2 and the ceiling 3 and arranged so as to surround the periphery of the reaction space K, all within the chamber.

The susceptor 2 has a disc-shaped turntable 5 and a rotating shaft 6 attached to a central portion of the lower surface of the turntable 5, and the turntable 5 is supported to rotate freely while integrated into a single unit with the rotating shaft 6. In addition, disc-shaped mounting stands (mounting portions) 7 on which the SiC wafers W are mounted are provided on the upper surface of the turntable 5.

A plurality of the mounting stands 7 are provided arranged in a row at equal intervals in the circumferential direction (rotating direction) of the turntable 5. In addition, each mounting stand 7 is supported to as to rotate freely about its respective central axis. The susceptor 2 employs a so-called planetary (rotary and revolutionary motion) system, and a mechanism is employed such that, when the rotating shaft 6 is driven to rotate by a drive motor not shown in the drawings, in addition to the turntable 5 being driven to rotate around the central axis thereof, each of the plurality of mounting stands 7 is driven to rotate about its respective central axis. As a result, film formation can be carried out uniformly on each SiC wafer W mounted on the plurality of mounting stands 7.

The ceiling 3 is a disc-shaped member having a diameter that roughly coincides with the turntable 5 of the aforementioned susceptor 2, and forms the flat reaction space K with the susceptor 2 while opposing the upper surface of the turntable 5. The sidewall 4 is a ring-shaped member that surrounds the outer peripheral portions of the susceptor 2 and the ceiling 3.

The CVD device 1 is provided with heating means for heating the SiC wafers W mounted on the aforementioned mounting stands 7 in the form of induction coils 8 for heating the susceptor 2 and the ceiling 3 by high-frequency induction heating. These heating coils 8 are arranged in opposition in close proximity to the lower surface of the susceptor 2 (turntable 5) and upper surface of the ceiling 3, respectively.

In this CVD device 1, when high-frequency current is supplied to the induction coils 8 from a high-frequency power supply not shown in the drawings, the susceptor 2 (turntable 5 and mounting stands 7) and the ceiling 3 are heated by high-frequency induction heating, thereby enabling the SiC wafers W mounted on the mounting stands 7 to be heated by radiant heat from the susceptor 2 and the ceiling 3 and by conductive heat from the mounting stands 7.

A graphite (carbon) material having superior heat resistance and favorable thermal conductivity can be used as a material suitable for high-frequency induction heating in the susceptor 2 (turntable 5 and mounting stands 7) and the ceiling 3, and member coated with SiC or TaC and the like on the surface thereof can be used preferably in order to prevent the generation of particles from the graphite (carbon). In addition, the heating means of the SiC wafers W is not limited to the aforementioned high-frequency inducting heating, but rather a member heated by resistance heating and the like may also be used. In addition, the heating means are not limited to a configuration in which they are arranged on the lower surface side of the susceptor 2 (turntable 5) and upper surface side of the ceiling 3, but rather a configuration can also be employed in which the heating means are arranged on only one of either of these sides.

The CVD device 1 is provided with a gas supply means that supplies the raw material gas G to the chamber in the form of a gas introduction pipe (gas inlet) 9 that introduces the raw material gas G into the reaction space K from the central portion of the upper surface of the ceiling 3. This gas introduction pipe 9 is formed into a cylindrical shape, and is arranged with the leading end portion (lower end portion) thereof facing the inside of the reaction space K in a state in which it passes through a circular opening 10 provided in the central portion of the ceiling 3.

In addition, a flange portion 9a protruding outwardly in the radial direction is provided on the leading end portion (lower end portion) of the gas introduction pipe 9. This flange portion 9a causes the raw material gas G that has been released vertically downward from the lower end portion of the gas introduction pipe 9 to flow radially in the horizontal direction between the ceiling 3 and the opposing turntable 5.

In this CVD device 1, as a result of the raw material gas G released from the gas introduction pipe 9 flowing radially from the inside to the outside of the reaction space K, the raw material gas G can be supplied parallel to the surfaces of the SiC wafers W. In addition, gas that is no longer required in the chamber can be evacuated outside the chamber from an exhaust port (not shown) provided in the outside of the aforementioned sidewall 4.

Here, although the ceiling 3 is heated at a high temperature by the aforementioned induction coils 8, the inner peripheral portion thereof (central portion where the opening 10 is formed) does not make contact with the gas introduction pipe 9 that is at a low temperature due to the introduction of the raw material gas G. In addition, the ceiling 3 is supported vertically upward as a result of the inner peripheral portion thereof being mounted on a support ring (support member) 11 attached to the outer peripheral portion of the gas introduction pipe 9. Moreover, this ceiling 3 can be moved in the vertical direction.

The CVD device 1 is provided with a shield 12 arranged in close proximity to the lower surface of the ceiling 3. This shield 12 is composed of a disc-shaped graphite (carbon) substrate coated with SiC on the surface thereof, and a circular opening 13 is provided in the central portion thereof through which the aforementioned gas introduction pipe 9 passes.

This shield 12 is removably attached inside the chamber. More specifically, this shield 12 is supported vertically upward as a result of the outer peripheral portion thereof being mounted on a support portion 14 provided protruding from the inner peripheral surface of the sidewall 4. In this case, as a result of supporting only the outer peripheral portion of the shield 12, the shield 12 can be removably attached within the chamber while avoiding contact between the gas introduction pipe 9 at a low temperature due to introduction of the raw material gas G and the inner peripheral portion (central portion where the opening 13 is formed) of the shield 12 at a high temperature as a result of being heated by the aforementioned induction coils 8.

In addition, the support portion 14 is a step portion provided over the entire circumference of the inner peripheral wall of the sidewall 14, and the outer peripheral portion of the shield 12 is mounted on this step portion. In this case, since the outer peripheral portion of the shield 12 makes contact over the entire circumference of the support portion (step portion) 14, gas can be prevented from flowing in from the outer peripheral portion side of the shield 12 towards the space between the shield 12 and the ceiling 13.

On the other hand, a cylindrical sleeve portion 15 is provided protruding from the central portion of the lower surface of the ceiling 13 so as to be positioned inside the opening 13 of the aforementioned shield 12. This sleeve portion 15 makes it difficult for gas to flow in from the inner peripheral portion side of the shield 12 towards the space between the shield 12 and the ceiling 13.

Figure 2:
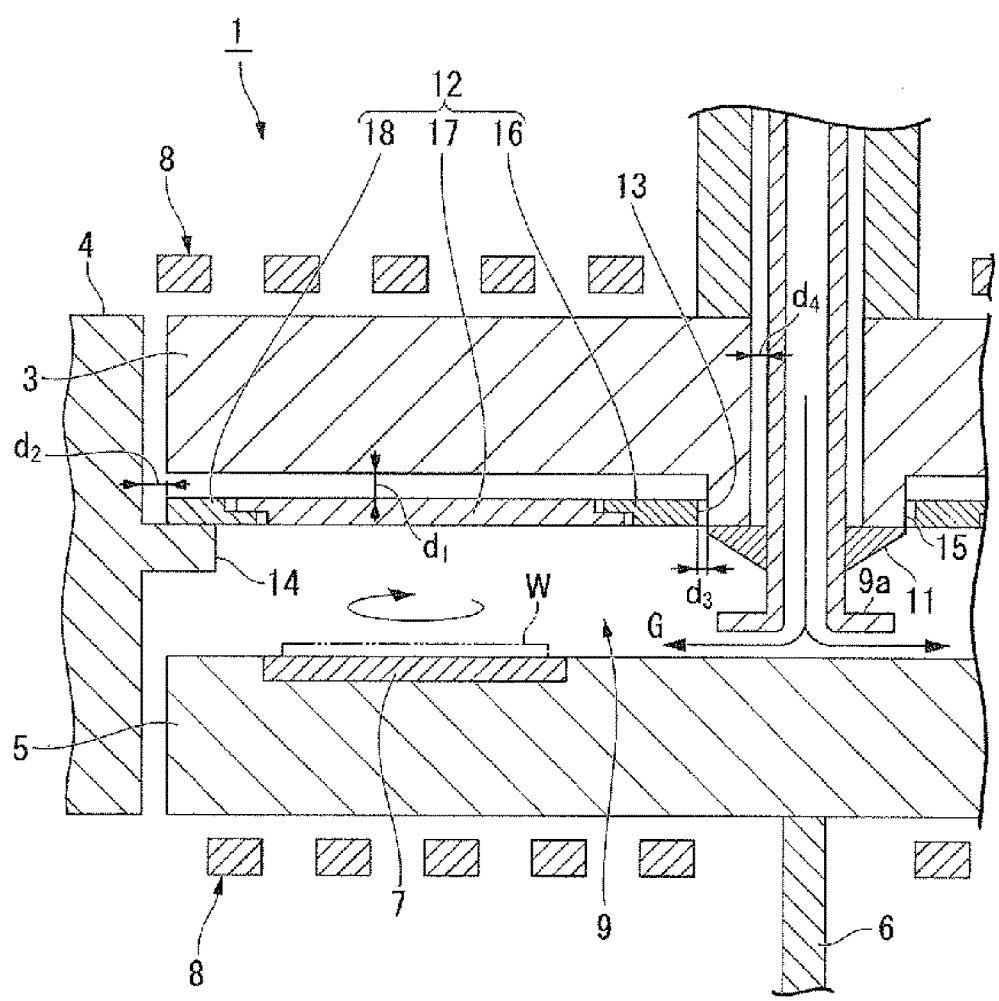
FIG. 2 is a cross-sectional schematic diagram showing an enlarged view of the essential portions of the manufacturing device shown in FIG. 1.

Here, as shown in FIG. 2, although a gap $d_1$ between the upper surface of the shield 12 and the lower surface of the ceiling 13 is set as required, it is preferably set to a range of 0.5 mm to 1 mm. This is to allow the shield 12 to prevent deposits of SiC from being deposited on the lower surface of the ceiling 13.

In addition, although a gap $d_2$ between the outer peripheral surface of the shield 12 and the inner peripheral surface of the sidewall 14 is set as required, it is preferably set to a range of 1.0 mm to 3.0 mm. This is to prevent the shield 12 from contacting the sidewall 4 due to thermal expansion during heating.

In addition, although a gap $d_3$ between the inner peripheral surface of the shield 12 and the outer peripheral surface of the sleeve portion 15 is set as required, it is preferably set to a range of 0.5 mm to 1 mm. This is for making it difficult for gas to flow in from the inner peripheral portion side of the shield 12 towards the space between the shield 12 and the ceiling 13 while preventing the shield 12 from contacting the sleeve portion 15 due to thermal expansion during heating.

In addition, although a gap $d_4$ between the inner peripheral surface of the ceiling 3 and the outer peripheral surface of the gas introduction pipe 9 is set as required, it is preferably set to a range of 0.4 mm to 0.6 mm. This is to prevent the gas introduction pipe 9 at a low temperature due to introduction of the raw material gas G from being affected by radiant heat from the ceiling 3 at a high temperature as a result of being heated by the aforementioned induction coils 8.

In addition, the thickness of the shield 12 is set as required. Although greater thickness is preferable for securing the mechanical strength thereof, since cracking conversely occurs if the shield 12 is excessively thick, the thickness is preferably within a range of 2 mm to 6 mm and more preferably within a range of 2 mm to 4 mm. In the case of reducing the thickness of the shield 12, a silicon carbide shield (such as a silicon carbide polycrystalline sintered material) is used preferably since it has high mechanical strength.

Figure 3A:
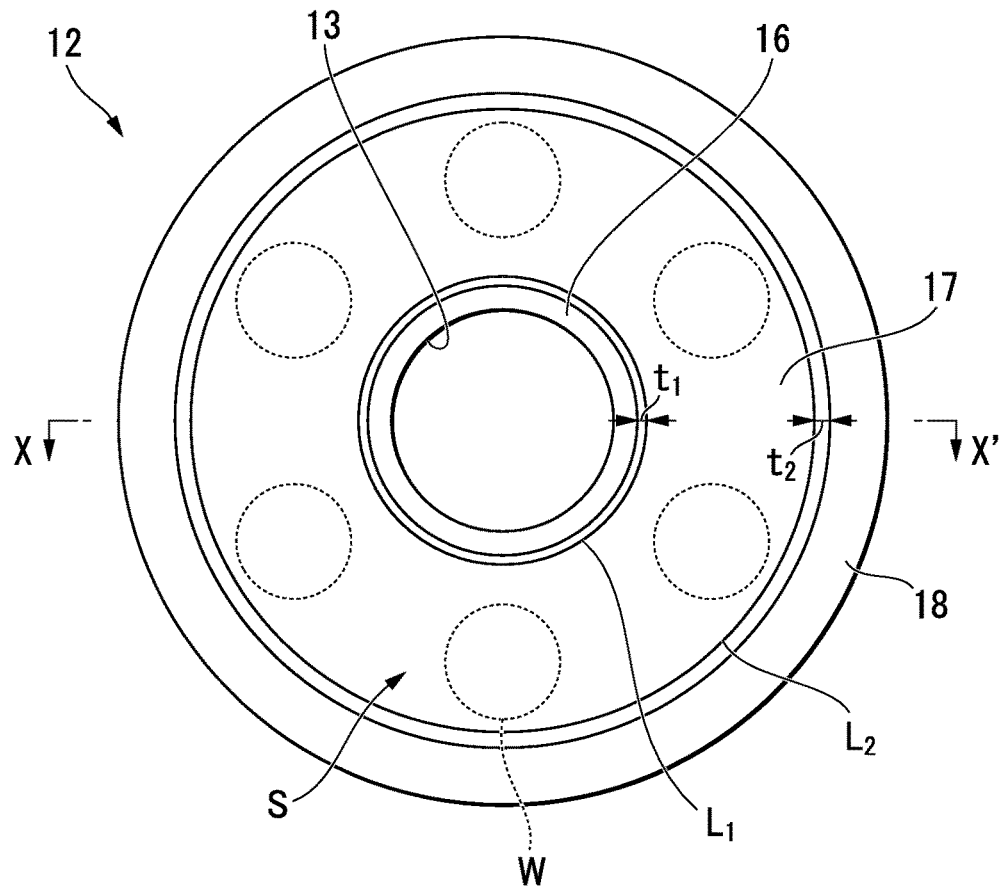
FIG. 3A is an overhead view of a shield divided into three sections.
Figure 3B:
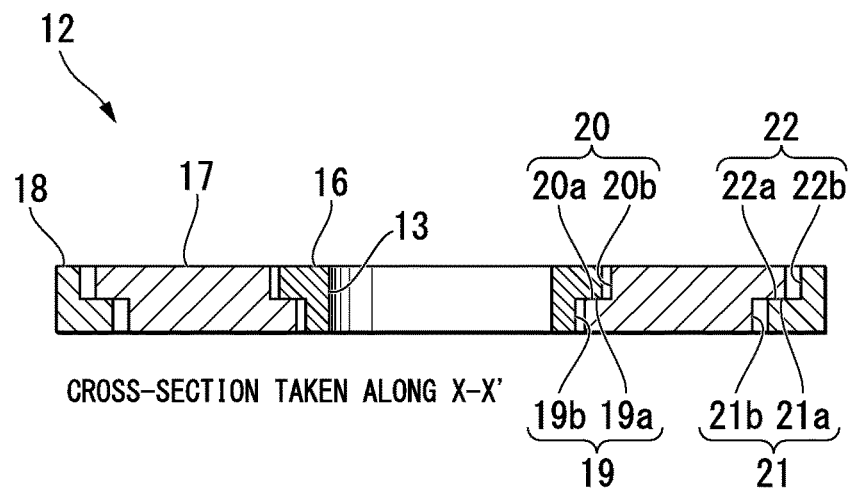
FIG. 3B is a cross-sectional view of the aforementioned shield divided into three sections.

As shown in FIGS. 2, 3A and 3B, the shield 12 has a structure in which it is concentrically divided into a plurality of ring plates 16, 17 and 18 centering around the aforementioned opening 13. More specifically, the shield 12 has a structure in which it is divided into three sections consisting of an inner peripheral ring plate 16, a central ring plate 17 and an outer peripheral ring plate 18 moving from the inside towards the outside thereof.

Among these ring plates, the inner peripheral ring plate 16 is held inside the central ring plate 17, and the central ring plate 17 is held inside the outer peripheral ring plate 18. In addition, a dividing line $L_1$ between the inner peripheral ring plate 16 and the central ring plate 17 is located farther to the inside than a region S where the plurality of mounting stands 7 are arranged in a row in the circumferential direction. On the other hand, a dividing line $L_2$ between the central ring plate 17 and the outer peripheral ring plate 18 is positioned farther to the outside than the region S where the plurality of mounting stands 7 are arranged in a row in the circumferential direction. Namely, these dividing lines $L_1$ and $L_2$ are set at locations that do not overlap with the region S when viewed from overhead. As a result, the central ring plate 17 is arranged in opposition to the region S so as not to overlap with the region S when viewed from overhead.

In addition, a first inner step portion 19 is provided in the outer peripheral portion on the lower surface side of the inner peripheral ring 16 over the entire circumference thereof. Corresponding thereto, a first outer step portion 20 is provided in the inner peripheral portion on the upper surface side of the central ring 17 over the entire circumference thereof. The first inner step portion 19 and the first outer step portion 20 are engaged in a state in which step surfaces 19a and 20a are in mutual contact. As a result, the outer peripheral portion of the inner peripheral ring plate 16 is supported vertically upward by the inner peripheral portion of the central ring plate 17.

Similarly, a second inner step portion 21 is provided in the outer peripheral portion of the central ring plate 17 over the entire circumference thereof. Corresponding thereto, a second outer step portion 22 is provided in the inner peripheral portion of the outer peripheral ring plate 18 over the entire circumference thereof. The second inner step portion 21 and the second outer step portion 22 are engaged in a state in which in which step surfaces 21a and 22a are in mutual contact. As a result, the outer peripheral portion of the central ring plate 17 is supported vertically upward by the inner peripheral portion of the outer peripheral ring plate 18.

In addition, gaps $t_1$ and $t_2$ are respectively provided between a lateral surface 19b of the first inner step portion 19 and a lateral surface 20b of the first outer step portion 20, and between a lateral surface 21b of the second inner step portion 21 and a lateral surface 22b of the second outer step portion 22. These gaps $t_1$ and $t_2$ are provided to prevent contact between the lateral surfaces 19b, 20b, 21b and 22b of mutually adjacent ring plates 16, 17 and 18 on both sides of the aforementioned dividing lines $L_1$ and $L_2$ caused by thermal expansion during heating. Although these gaps $t_1$ and $t_2$ are selected arbitrarily, they are preferably provided within a range of 0.3 mm to 0.7 mm. Moreover, since the shield 12 is more susceptible to thermal expansion on the outside than on the inside, the inner gap $t_1$ can be set to a greater value than the outer gap $t_2$ ($t_1 > t_2$) in consideration thereof.

The aforementioned dividing lines $L_1$ and $L_2$ are provided based on the lateral surface 20b of the first outer step portion 20 and the lateral surface 21b of the second inner step portion 21 in the central ring plate 17 as viewed from the lower surface side of the shield 12. As a result, in the case of having set the aforementioned dividing lines $L_1$ and $L_2$ at locations that do not overlap with the region S when viewed from overhead, the central ring plate 17 can be arranged so as not to overlap with the region S when viewed from overhead.

The inner peripheral ring plate 16, the central ring plate 17 and the outer peripheral ring plate 18 are formed to mutually the same thickness. The lower surfaces of the shield 12 composed by these ring plates 16, 17 and 18 are mutually on the same plane. As a result, high-quality SiC epitaxial layers can be stably deposited and grown on the surfaces of the SiC wafers W while smoothly supplying the raw material gas G released from the aforementioned gas introduction pipe 9 from the inside towards the outside of the reaction space K. Furthermore, the upper surfaces of each of the ring plates 16, 17 and 18 of the shield 12 are also mutually on the same plane.

In the CVD device 1 having the structure described above, in addition to the turntable 5 being driven to rotate about the central axis thereof, the plurality of mounting stands 7 are driven to rotate about their respective central axes. In addition, while in this state, the raw material gas G released from the gas introduction pipe 9 is forced to radially flow from the inside to the outside of the reaction space K while heating the SiC wafers W mounted on the mounting stands 7. As a result, the raw material gas G is supplied parallel to the surfaces of the SiC wafers W. At this time, SiC epitaxial layers are grown while depositing on the surfaces of the SiC wafers by thermal decomposition and chemical reaction of the raw material gas G. As a result, SiC epitaxial layers can be formed in the form of thin films on the surfaces of the SiC wafers W.

However, in the CVD device 1 to which the present invention is applied, the shield 12 is arranged in close proximity to the lower surface of the ceiling 3 so as to prevent deposits from being deposited on the lower surface of the ceiling 3 as was previously described. As a result, deposits are deposited on the lower surface of the shield 12.

In this CVD device 1, since the shield 12 is removably attached inside the chamber, the aforementioned particles and downfall can be reduced simply by carrying out simple maintenance work consisting of replacing the shield without having to carry out bothersome cleaning work such as removing deposits deposited on the lower surface of the ceiling 13 as in the prior art.

When replacing the shield 12, the shield 12 located to the inside of the aforementioned sidewall 4 can be easily removed or attached by moving the aforementioned ceiling 13 vertically.

In the present invention, thermal stress acting on the shield 12 is alleviated among the divided ring plates 16, 17 and 18 by using the shield 12 in which the plurality of ring plates 16, 17 and 18 are concentrically divided centering around the aforementioned opening 13.

More specifically, in the aforementioned CVD device 1, although the dividing line $L_1$ between the inner peripheral ring plate 16 and the central ring plate 17 is located farther to the inside than the region S where the plurality of mounting stands 7 are arranged in a row in the circumferential direction, the dividing line $L_2$ between the central ring plate 17 and the outer peripheral ring plate 18 is located farther to the outside than this region S.

In this case, when a thermal change has acted on the shield 12 as a result of being heated by the induction coils 8, thermal stress acting on the inner peripheral side and outer peripheral side of the shield 12 where there are large changes in heat can be efficiently alleviated. Thus, the occurrence of warping (deformation) or cracking and the like of the shield 12 divided into the plurality of ring plates 16, 17 and 18 can be prevented.

In addition, in the present invention, deposits deposited on the lower surface of the shield 12 can be inhibited from falling off by preventing the occurrence of warping (deformation) of the shield 12. In particular, since the aforementioned shield 12 is composed of a graphite substrate coated with the same SiC film as the SiC epitaxial layers on the surface thereof, the depositability of deposits can be enhanced. As a result, deposits deposited on the lower surface of the shield 12 can be inhibited from falling off. In addition, the times at which each of the ring plates 16, 17 and 18 that compose the shield 12 is replaced can be extended.

Moreover, in the present invention, it is also possible to only replace one ring plate 16 (or 17 or 18) of the shield 12 divided into the plurality of ring plates 16, 17 and 18.

For example, in SiC deposits deposited on the lower surface of the aforementioned shield 12, there is a region where the ratio of Si is greater that is present to the inside of a region where the ratios of Si and C contained in the SiC deposits are equal. In addition, this region where the ratio of Si is greater has been determined to result in more rapid growth of SiC deposits than the region where the ratios of Si and C are equal.

Therefore, in the present invention, the location of the dividing line L1 between the aforementioned inner peripheral ring plate 16 and the aforementioned central ring plate 17 is set so that the aforementioned inner peripheral ring plate 16 is arranged in this region where the ratio of Si is greater. As a result, the times at which the other ring plates 17 and 18 are replaced can be extended by replacing only the inner peripheral ring plate 16 of the shield divided into a plurality of the ring plates 16, 17 and 18 that is arranged in this region where the ratio of Si is greater.

(Epitaxial Wafer Manufacturing Method)

The epitaxial wafer manufacturing method to which the present invention is applied is characterized by comprising a step for depositing and growing epitaxial layers on the surfaces of wafers using the aforementioned CVD device 1 of the present invention.

When manufacturing epitaxial wafers, after having sliced SiC ingots fabricated using a method such as sublimation crystallization into the shape of discs, SiC wafers that have undergone polishing and the like on the surfaces thereof are fabricated or prepared. Epitaxial wafers can then be fabricated by depositing and growing (epitaxially growing) SiC epitaxial layers on the surfaces of the SiC wafers using the aforementioned CVD device 1.

In the epitaxial wafer manufacturing method to which the present invention is applied, high-quality SiC epitaxial layers can be stably deposited and grown on the surfaces of the SiC wafers W by using the aforementioned CVD device 1. Since the amount of time spent on maintaining the aforementioned CVD device 1 can be shortened, the product yield of epitaxial wafers can be further improved.

The present invention is not limited to the aforementioned embodiment, but rather various modifications can be added within a range that does not deviate from the gist of the present invention. In addition, in the following explanation, in addition to omitting explanations of those sites that are the same as those of the aforementioned CVD device 1, the same reference symbols are used to represent those sites that are the same as in the aforementioned CVD device 1.

Figure 4:
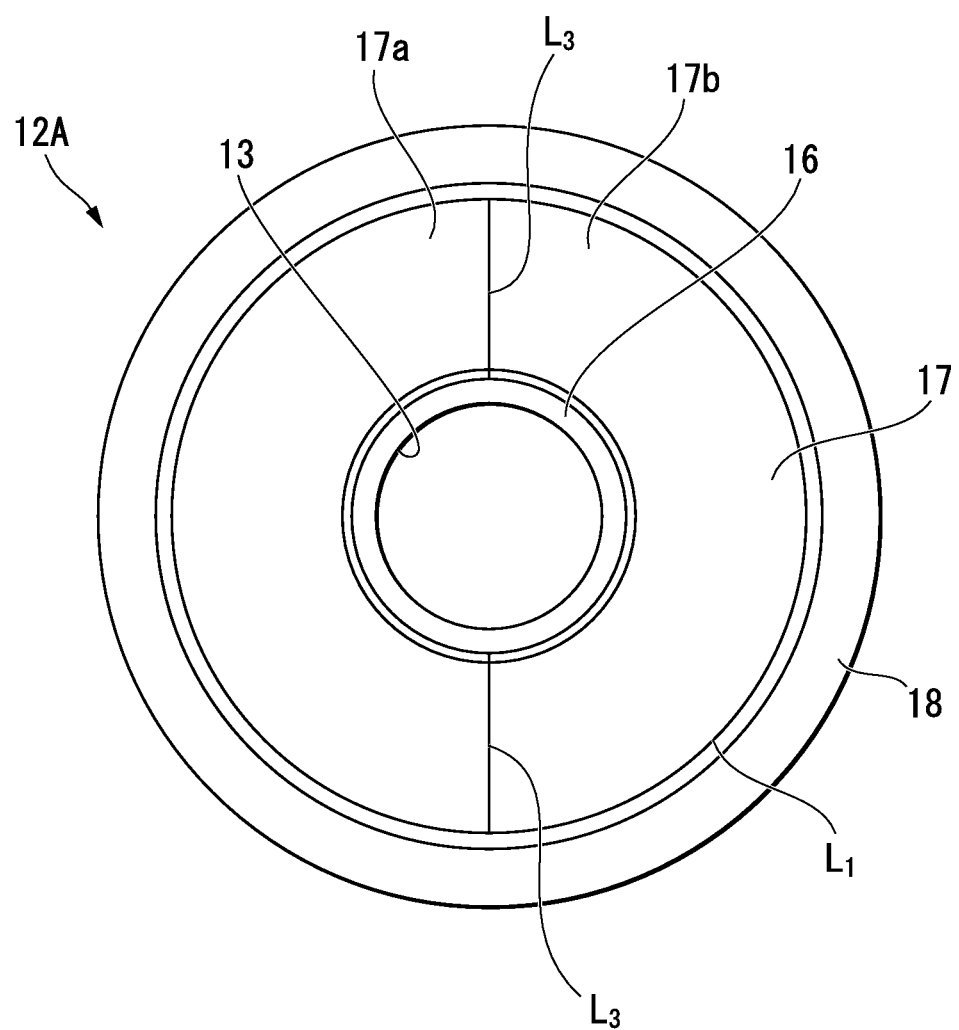
FIG. 4 is an overhead view showing a variation of a shield.

In the present invention, a configuration can be employed in which, for example, the central ring plate 17 is divided into a plurality of ring pieces 12a and 12b along dividing lines $L_3$ extending in the radial direction in the manner of the shield 12 shown in FIG. 4.

More specifically, the central ring plate 17 is divided into two ring pieces 12a and 12b so as to be symmetrical about the two dividing lines $L_3$ extending in the diametrical direction. In this case, thermal stress acting on the shield 12A can be further alleviated between the divided ring pieces 17a and 17b. Thus, the occurrence of warping (deformation) or cracking and the like in the central ring plate 17 divided into a plurality of ring pieces 17a and 17b can be further inhibited.

In the present invention, a configuration can be employed in which any ring plate 16 (or 17 or 18) among the plurality of concentrically divided ring plates 16, 17 and 18 is divided into a plurality of ring pieces along dividing lines extending in the radial direction centering around the opening 13. In addition, the number of divided ring pieces and the locations of the dividing lines can be altered as is suitable.

In addition, in the aforementioned embodiment, although an explanation was provided regarding a configuration in which the aforementioned shield 12 was divided into three ring plates consisting of ring plates 16, 17 and 18, the number of concentrically divided ring plates around an opening can be altered as is suitable.

For example, a configuration can be employed in which a shield is divided into two sections consisting of an inner peripheral ring plate 16A (16B) and an outer peripheral ring plate 18A (18B) in the manner of shields 12B and 12C shown in FIGS. 5 and 6.

In this case as well, thermal stress acting on the shield 12 can be alleviated between these two divided ring plates 16A (16B) and 18A (18B).

In addition, in the case of composing the shield 12B (12C) with the two divided ring plates 16A (16B) and 18A (18B), the dividing line $L_1$ ($L_2$) between the inner peripheral ring plate 16A (16B) and the outer peripheral ring plate 18A (18B) is preferably located farther to the inside or outside than the region S where the plurality of mounting stands 7 are arranged in a row in the circumferential direction so as not to overlap with this region S.

Figure 5A:
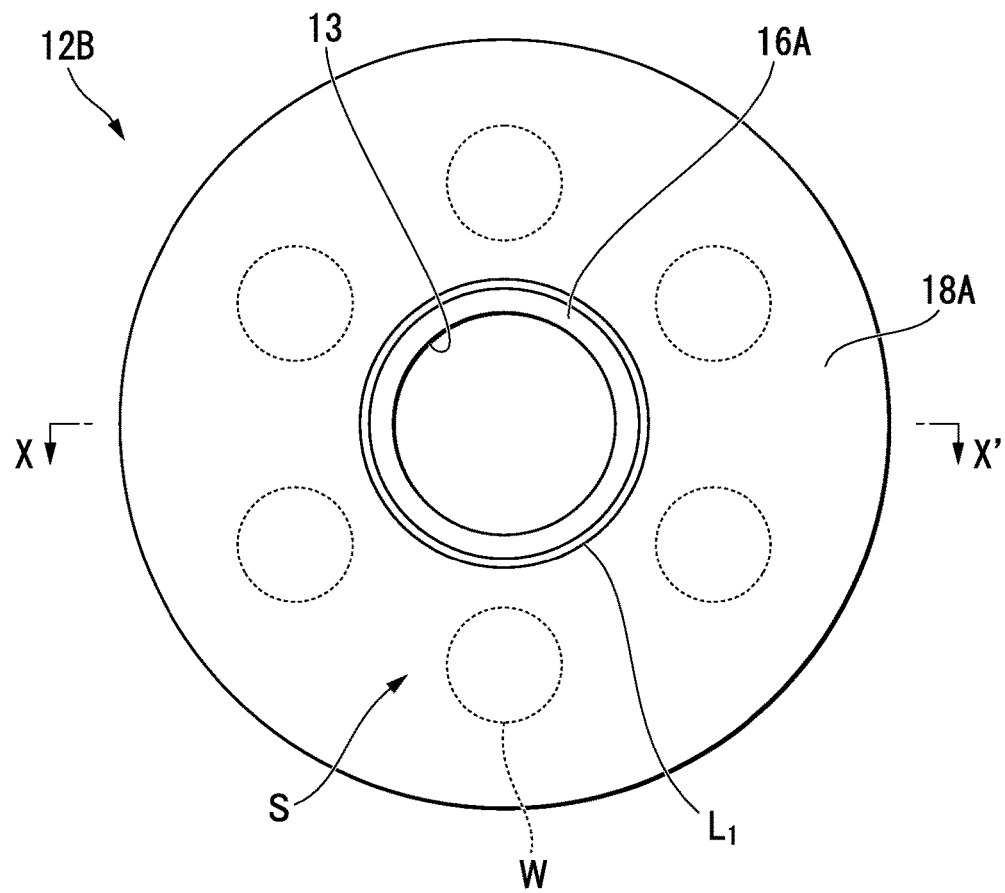
FIG. 5A is an overhead view of an example of a shield divided into two sections.
Figure 5B:
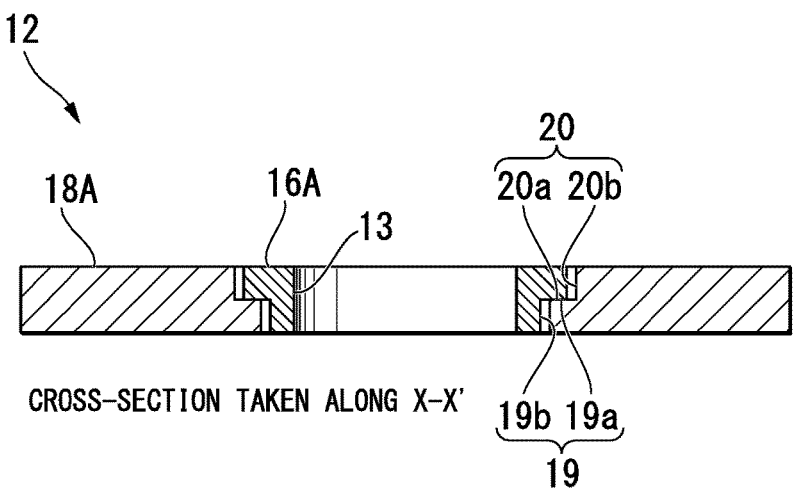
FIG. 5B is a cross-sectional view of the aforementioned example of a shield divided into two sections.

Namely, by positioning the dividing line $L_1$ between the inner peripheral ring plate 16A and the outer peripheral ring plate 18A farther to the inside than the region S in the manner of the shield 12B shown in FIGS. 5A and 5B, heat stress acting on the inner peripheral side of the shield 12, where there are large changes in heat, can be efficiently alleviated. Moreover, the location of the dividing line $L_1$ is set so that the inner peripheral ring plate 16A is arranged in a region where the ratio of Si is greater. As a result, it is possible to only replace the inner peripheral ring plate 16A arranged in the aforementioned region where the ratio of Si is greater, thereby making it possible to extend the time at which the outer peripheral ring plate 18A is replaced.

Figure 6A:
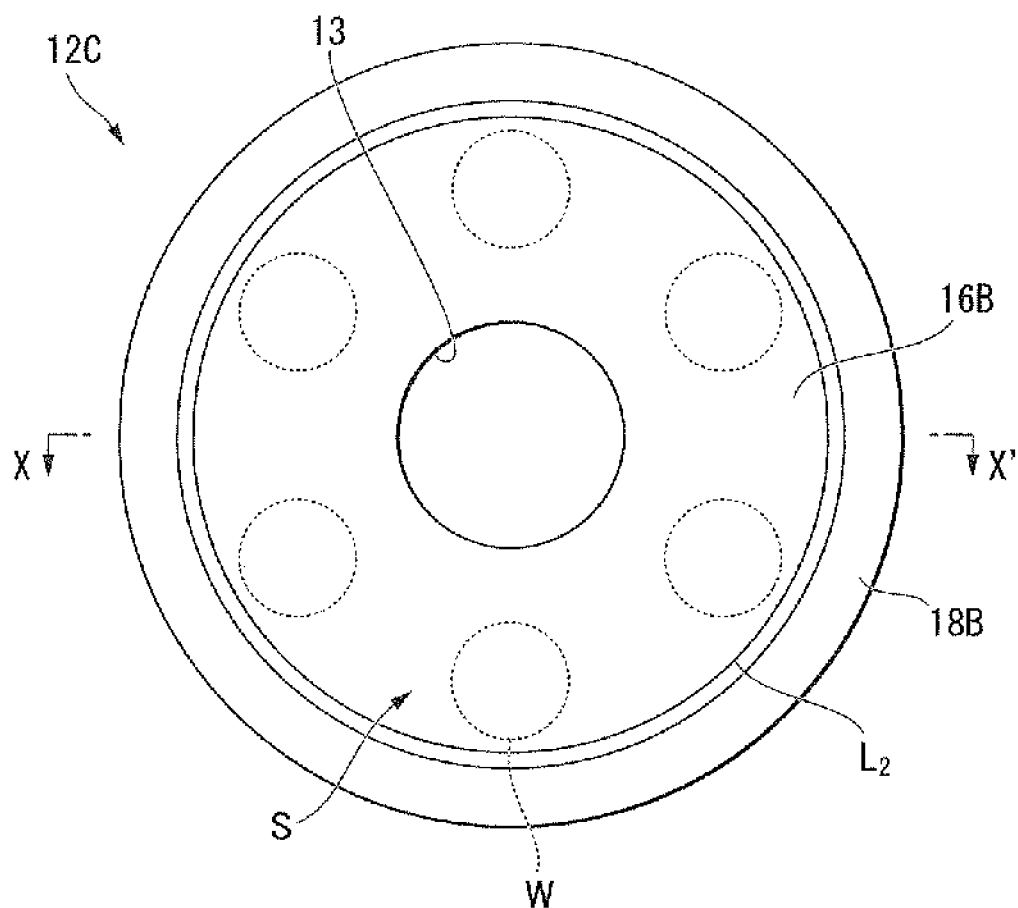
FIG. 6A is an overhead view of another example of a shield divided into two sections.
Figure 6B:
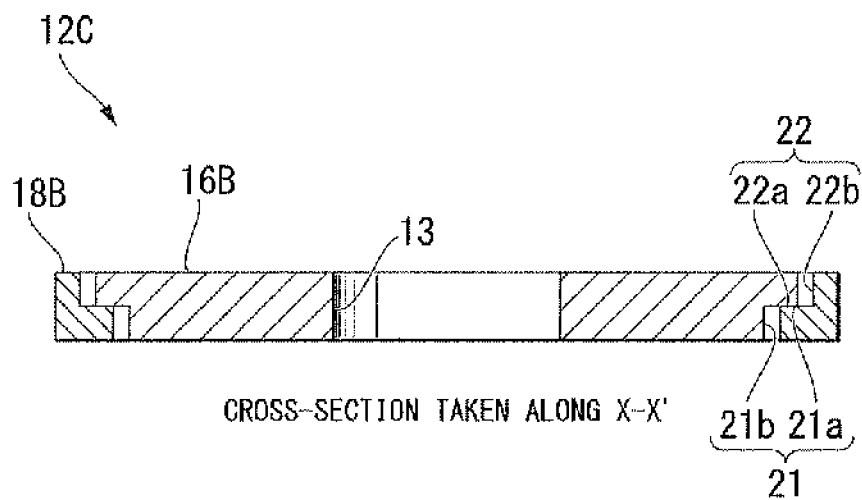
FIG. 6B is a cross-sectional view of the aforementioned other example of a shield divided into two sections.

On the other hand, thermal stress acting on the outer peripheral side of the shield 12, where there are large changes in heat, can be efficiently alleviated by positioning the dividing line $L_2$ between the inner peripheral ring plate 16B and the outer peripheral ring plate 18B farther to the outside than the region S in the manner of the shield 12C shown in FIGS. 6A and 6B. Since changes in heat are greater on the outer peripheral side than the inner peripheral side of the shield in particular, this is particularly effective in cases of preventing the occurrence of warping (deformation) or cracking of the shield 12C.

In the present invention, in the case of having divided the shield into a plurality of ring plates, different materials can be used for these ring plates. In this case, although an SiC substrate or graphite substrate coated with the same SiC film as the SiC epitaxial layers on the surface thereof is preferable for the ring plate arranged at a location opposing the aforementioned region S (location where overlapping when viewed from above), a combination of different materials, such as a graphite substrate coated with a TaC film on the surface thereof can also be used for the ring plate arranged at a location that overlaps with the aforementioned region S when viewed from overhead.

EXAMPLES

The following provides a more detailed explanation of the effects of the present invention through examples thereof. The present invention is not limited to the following examples, and can be carried out by suitably modifying within a range that does not deviate from the gist thereof.

Figure 7:
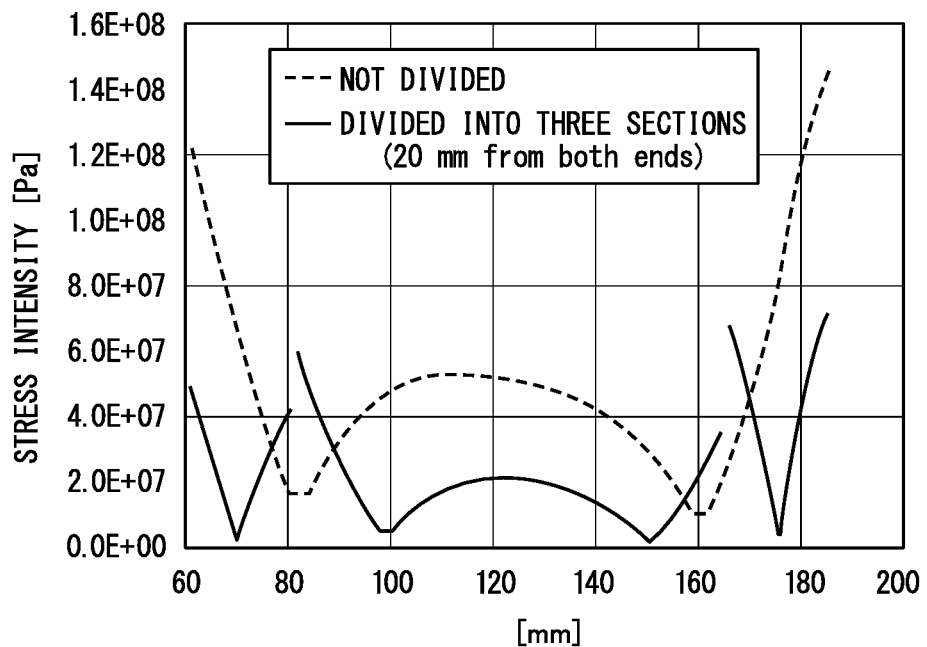
FIG. 7 is a graph indicating the results of calculating thermal stress acting on a shield divided into three sections by computer simulation (at 20 mm from both ends).
Figure 8:
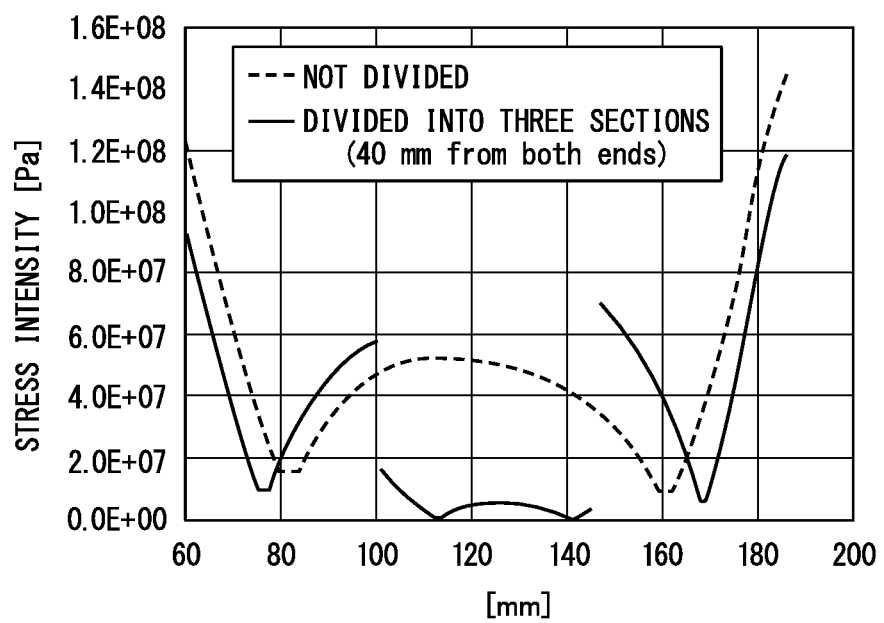
FIG. 8 is a graph indicating the results of calculating thermal stress acting on the aforementioned shield divided into three sections by computer simulation (at 40 mm from both ends).

In the present example, thermal stress actually acting on a shield divided into three concentric ring plates centering around an opening was calculated by computer simulation. The results of this computer simulation are shown in FIGS. 7 and 8. In this computer simulation, an SiC substrate (shield) having a diameter of 200 mm, opening diameter of 60 mm and thickness of 2 mm was divided into three concentric ring plates centering around the opening, and calculations were carried out by setting the dividing lines of these ring plates at locations 20 mm (FIG. 7) and 40 mm (FIG. 8), respectively, from both ends of the inner periphery and outer periphery. In addition, calculations were carried out based on a coefficient of thermal expansion of SiC of $4.5 \times 10^{-6}/°C$. and setting the heating temperature thereof to 1700° C. In addition, the graphs of FIGS. 7 and 8 also indicate simulation results for the case of not dividing the shield into ring plates for reference purposes.

As shown in FIGS. 7 and 8, thermal stress acting on the shield was determined to be alleviated among the three divided ring plates. Thermal stress acting on the inner peripheral side and outer peripheral side of the shield, where there are particularly large changes in heat, was able to be efficiently alleviated.

Next, in a configuration similar to that of the shield 12 shown in the aforementioned FIGS. 3A and 3B, changes in the gaps $t_1$ and $t_2$ after heating were calculated by computer simulation in the case of making the width of the step surfaces of each step portion to be 4.0 mm, making the gap $t_1$ between the step portions of the inner peripheral ring plate and the central ring plate to be 0.4 mm, and making the gap $t_2$ between the step portions of the central ring plate and the outer peripheral ring plate to be 0.6 mm. The results of this simulation are shown in Table 1. The width of the portion contacted by the step portion surfaces (value determined by subtracting the gap $t_2$ or $t_1$ from the width of the step portion surface) is also shown in Table 1 along with the gaps $t_1$ and $t_2$.

TABLE 1

| (Units: mm) | | Before heating | After heating |
|---|---|---|---|
| Inner peripheral ring plate to central ring plate | Contact portion | 3.6 | 3.571 |
| | Gap $t_1$ | 0.4 | 0.399 |
| Central ring plate to outer peripheral ring plate | Contact portion | 3.4 | 3.408 |
| | Gap $t_2$ | 0.6 | 0.457 |

As shown in Table 1, although the gap $t_1$ between the step portions of the inner peripheral ring plate and the central ring plate and the gap $t_2$ between the step portions of the central ring plate and the outer peripheral ring plate decreased due to thermal expansion after heating, contact between the lateral surfaces of the step portions of adjacent ring plates on both sides of the dividing line was able to be prevented.

INDUSTRIAL APPLICABILITY

According to the epitaxial wafer manufacturing device of the present invention, high-quality epitaxial layers can be stably deposited and grown on the surfaces of wafers.

DESCRIPTION OF REFERENCE SIGNS

1 CVD device (epitaxial wafer manufacturing device)
2 Susceptor
3 Ceiling (top plate)
4 Sidewall
5 Turntable
6 Rotating shaft
7 Mounting stands (mounting portions)
8 Induction coils (heating means)
9 Gas introduction pipe (gas inlet)
10 Opening
11 Support ring (support member)
12, 12A, 12B, 12C Shield
13 Opening
14 Support portion (step portion)
15 Sleeve portion
16, 16A Inner peripheral ring plate 17 Central ring plate
18A, 18B Outer peripheral ring plate
19 First inner step portion
19a Step surface
19b Lateral surface
20 First outer step portion
20a Step surface
20b Lateral surface
21 Second inner step portion
21a Step surface
21b Lateral surface
22 Second outer step portion
22a Step surface
22b Lateral surface
G Raw material gas
K Reaction space
W SiC wafers(wafers)

The invention claimed is:

1. An epitaxial wafer manufacturing device that deposits and grows epitaxial layers on the surfaces of heated wafers while supplying a raw material gas to a chamber, provided with:
  a susceptor having a plurality of mounting portions on which the wafers are mounted, wherein the plurality of mounting portions are arranged in a row in the circumferential direction;
  a top plate arranged in opposition to the upper surface of the susceptor so as to form a reaction space between the top plate and the susceptor;
  a heating means arranged on the lower surface side of the susceptor and/or upper surface side of the top plate for heating the wafers mounted on the mounting portions;
  a gas supply means having a gas inlet for introducing the raw material gas from a central portion of the upper surface of the top plate to the reaction space, that supplies raw material gas released from the gas inlet from the inside to the outside of the reaction space; and,
  a shield arranged in close proximity to the lower surface of the top plate so as to prevent deposits from being deposited on the lower surface of the top plate; wherein,
  in addition to being removably attached inside the chamber, the shield has an opening in the central portion thereof that forces the gas inlet to face the inside of the reaction space, and has a structure in which it is divided into a plurality of distinct ring plates that are concentric around the opening and removably attached to one another.

2. The epitaxial wafer manufacturing device according to claim 1, provided with a sidewall located outside the susceptor and the top plate and arranged so as to surround the periphery of the reaction space, wherein
  a support portion for supporting the shield is provided on the inner peripheral surface of the sidewall.

3. The epitaxial wafer manufacturing device according to claim 2, wherein the support portion is a step portion provided over the entire circumference on the inner peripheral surface of the sidewall, and supports the shield in a state in which the outer peripheral portion of the shield is mounted on this step portion.

4. The epitaxial wafer manufacturing device according to claim 1, wherein, among adjacent ring plates on both sides of each dividing line of the plurality of concentrically divided ring plates, an inner step portion provided on the outer peripheral portion on the lower surface side of the ring plate located to the inside of the dividing line, and an outer step portion provided on the inner peripheral portion on the upper surface side of the ring plate located to the outside of the dividing line, are engaged in a state in which their mutual step surfaces are in contact, and a gap is provided between the lateral surface of the inner step portion and the lateral surface of the outer step portion.

5. The epitaxial wafer manufacturing device according to claim 1, wherein at least the lower surfaces of the plurality of concentrically divided ring plates are on the same plane.

6. The epitaxial wafer manufacturing device according to claim 1, wherein the shield has a structure in which it is divided into an inner peripheral ring plate, a central ring plate and an outer peripheral ring plate moving from the inside to the outside, and
  a dividing line between the inner peripheral ring plate and the central ring plate is located farther to the inside than the region where the plurality of mounting portions are arranged in a row in the circumferential direction, and a dividing line between the central ring plate and the outer peripheral ring plate is located farther to the outside than the region where the plurality of mounting portions are arranged in a row in the circumferential direction.

7. The epitaxial wafer manufacturing device according to claim 1, wherein the shield has a structure in which it is divided into an inner peripheral ring plate and an outer peripheral ring plate moving from the inside to the outside, and
  a dividing line between the inner peripheral ring plate and the outer peripheral ring plate is located farther to the inside or outside than the region where the plurality of mounting portions are arranged in a row in the circumferential direction.

8. The epitaxial wafer manufacturing device according to claim 6, wherein the wafer is an SiC single crystal substrate and the epitaxial layer is an SiC single crystal thin film, and
  in an SiC deposit deposited on the lower surface of the shield, has a region where the ratio of Si is greater to the inside of a region where the ratios of Si and C contained in the SiC deposit are equal, and a dividing line between the inner peripheral ring plate and the central or outer peripheral ring plate is located so that the inner peripheral ring plate is arranged in this region where the ratio of Si is greater.

9. The epitaxial wafer manufacturing device according to claim 1, wherein any of the ring plates among the plurality of concentrically divided ring plates is divided into a plurality of ring pieces along dividing lines extending in the radial direction centering around the opening.

10. The epitaxial wafer manufacturing device according to claim 1, wherein the wafer is an SiC single crystal substrate and the epitaxial layer is an SiC single crystal thin film, and
  a graphite substrate coated with an SiC film on the surface thereof or an SiC substrate is at least used for the ring plate arranged at a location opposing the region where the plurality of mounting portions are arranged in a row in the circumferential direction.

11. The epitaxial wafer manufacturing device according to claim 1, having a structure wherein the susceptor is driven to rotate about the central axis thereof and the plurality of mounting portions are driven to rotate about their respective central axes.

* * * * *